United States Patent
Tsai et al.

(10) Patent No.: US 11,211,295 B2
(45) Date of Patent: Dec. 28, 2021

(54) FINFET DOPING METHODS AND STRUCTURES THEREOF

(71) Applicant: Taiwan Semiconductor Manufacturing Company, Ltd., Hsin-Chu (TW)

(72) Inventors: Chun Hsiung Tsai, Xinpu Township (TW); Wei-Yuan Lu, Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 173 days.

(21) Appl. No.: 16/717,398

(22) Filed: Dec. 17, 2019

(65) Prior Publication Data

US 2020/0126871 A1    Apr. 23, 2020

Related U.S. Application Data

(60) Continuation of application No. 15/443,068, filed on Feb. 27, 2017, now Pat. No. 10,522,424, which is a
(Continued)

(51) Int. Cl.
*H01L 21/8238* (2006.01)
*H01L 21/8234* (2006.01)
(Continued)

(52) U.S. Cl.
CPC .......... *H01L 21/823892* (2013.01); *H01L 21/02576* (2013.01); *H01L 21/02579* (2013.01);
(Continued)

(58) Field of Classification Search
CPC ....... H01L 21/823892; H01L 29/66795; H01L 21/823814; H01L 21/823821;
(Continued)

(56) References Cited

U.S. PATENT DOCUMENTS

| 8,373,238 B2 | 2/2013 | Lee et al. |
| 8,673,704 B2 | 3/2014 | Zhu et al. |

(Continued)

FOREIGN PATENT DOCUMENTS

| CN | 103811320 | 5/2014 |
| CN | 103710587 | 4/2017 |

OTHER PUBLICATIONS

Van Zeghbroeck, Bart, Principles of Semiconductor Devices, Chapter 2: Semiconductor Fundamentals, http://ecee.colorado.edu/~bart/book/book/chapter2/ch2_7.htm, Boulder, Colorado, Aug. 2007, 13 pages.

*Primary Examiner* — Shahed Ahmed
*Assistant Examiner* — Vicki B. Booker
(74) *Attorney, Agent, or Firm* — Haynes and Boone, LLP (57) ABSTRACT

A method for fabricating a semiconductor device having a substantially undoped channel region includes providing a substrate having a fin extending from the substrate. An in-situ doped layer is formed on the fin. By way of example, the in-situ doped layer may include an in-situ doped well region formed by an epitaxial growth process. In some examples, the in-situ doped well region includes an N-well or a P-well region. After formation of the in-situ doped layer on the fin, an undoped layer is formed on the in-situ doped layer, and a gate stack is formed over the undoped layer. The undoped layer may include an undoped channel region formed by an epitaxial growth process. In various examples, a source region and a drain region are formed adjacent to and on either side of the undoped channel region.

20 Claims, 8 Drawing Sheets

Related U.S. Application Data division of application No. 14/340,249, filed on Jul. 24, 2014, now Pat. No. 9,583,342.

(51) Int. Cl.

| | | |
|---|---|---|
| *H01L 29/66* | (2006.01) | |
| *H01L 21/02* | (2006.01) | |
| *H01L 21/311* | (2006.01) | |
| *H01L 29/78* | (2006.01) | |
| *H01L 27/092* | (2006.01) | |
| *H01L 29/10* | (2006.01) | |

(52) U.S. Cl.
CPC ...... *H01L 21/02636* (2013.01); *H01L 21/311* (2013.01); *H01L 21/823431* (2013.01); *H01L 21/823481* (2013.01); *H01L 21/823493* (2013.01); *H01L 21/823814* (2013.01); *H01L 21/823821* (2013.01); *H01L 21/823878* (2013.01); *H01L 27/0924* (2013.01); *H01L 27/0928* (2013.01); *H01L 29/1037* (2013.01); *H01L 29/66545* (2013.01); *H01L 29/66795* (2013.01); *H01L 29/785* (2013.01); *H01L 29/7834* (2013.01)

(58) Field of Classification Search
CPC ......... H01L 21/823878; H01L 27/0924; H01L 27/0928; H01L 29/1037; H01L 29/66545; H01L 29/7834; H01L 21/823431; H01L 21/02576; H01L 21/02579; H01L 21/02636; H01L 21/311; H01L 21/823481; H01L 21/823493; H01L 29/785

See application file for complete search history.

(56) References Cited

U.S. PATENT DOCUMENTS

| | | |
|---|---|---|
| 9,847,404 B2 | 12/2017 | Strain et al. |
| 2013/0237026 A1 | 9/2013 | Lee et al. |
| 2014/0159126 A1* | 6/2014 | Wei ............ H01L 29/785 257/288 |
| 2014/0284723 A1 | 9/2014 | Lee et al. |
| 2015/0014788 A1 | 1/2015 | Park et al. |
| 2015/0364578 A1 | 12/2015 | Liu et al. |
| 2016/0027644 A1 | 1/2016 | Tsai et al. |

* cited by examiner

FINFET DOPING METHODS AND STRUCTURES THEREOF

PRIORITY DATA

The present application is a continuation application of U.S. application Ser. No. 15/443,068, filed Feb. 27, 2017, which is a divisional application of U.S. application Ser. No. 14/340,249, filed Jul. 24, 2014, each of which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, ion implantation of dopants through fins of FinFET devices, as done in current fabrication methods, directly contributes to the formation of defects and the introduction of impurities in a FinFET channel region. Such channel defects and impurities can cause scattering of carriers flowing through the FinFET channel, thus degrading channel mobility and adversely affecting device performance. Dopant implantation through FinFET fins may also result in a non-uniform doping profile, which among other issues can cause variability of FinFET device parameters. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Figure 1:
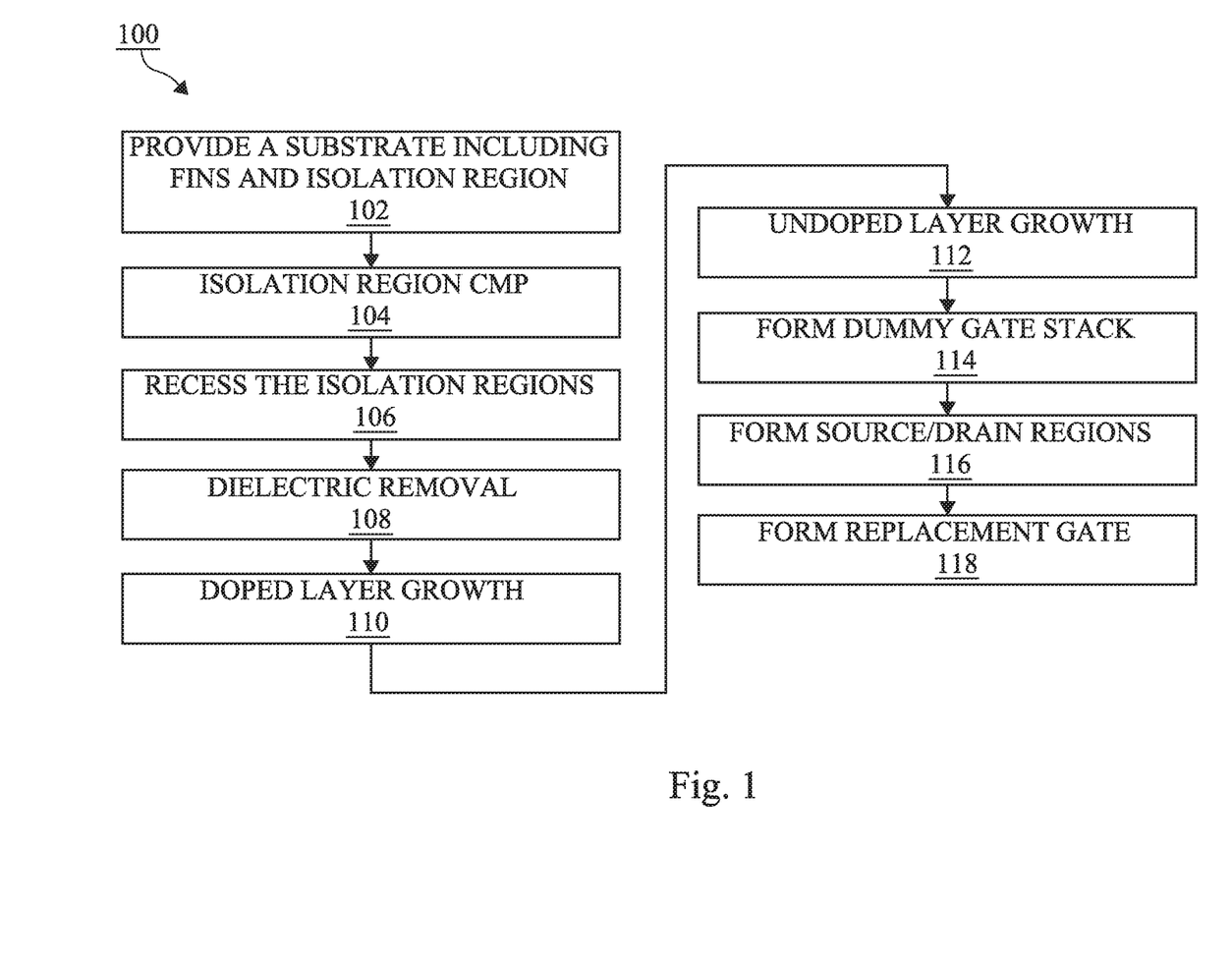
FIG. 1 is a flow chart of a method of fabricating a FinFET device or portion thereof according to one or more aspects of the present disclosure.

Illustrated in FIG. 1 is a method 100 of semiconductor fabrication including fabrication of fins having dopant-free channels disposed on a substrate. As used herein, the term "dopant-free" material is used to describe a material (e.g., a semiconductor material) having an extrinsic dopant concentration from about 0 cm$^{-3}$ to about $1 \times 10^{17}$ cm$^{-3}$. As discussed below, the presence of dopants in a device channel may cause carrier scattering in the active device channel, which can substantially degrade device performance. Devices, such as FinFET devices, having a substantially dopant-free epitaxially grown undoped channel region, as described below, may result in significantly improved device performance (e.g., increased device ON-current). A "dopant" or "extrinsic dopant", as used herein, is used to describe an impurity (e.g., B, P, As, etc.) that can be introduced into a semiconductor lattice for the purpose of changing the electrical properties of the semiconductor. For example, N-type impurities may be introduced into a semiconductor to form an N-type material, and P-type impurities may be introduced into a semiconductor to form a P-type material. It is understood that the method 100 includes steps having features of a complementary metal-oxide-semiconductor (CMOS) technology process flow and thus, are only described briefly herein. Additional steps may be performed before, after, and/or during the method 100.

FIGS. 2-7 and 8 are isometric and perspective views, respectively, of an embodiment of a semiconductor device 200 according to various stages of the method 100 of FIG. 1. It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to FIGS. 2-8, are merely exemplary and are not intended to be limiting beyond what is specifically recited in the claims that follow.

The method 100 begins at block 102 where a substrate is provided. In some embodiments, the substrate may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

In various embodiments, the substrate includes a plurality of fins extending therefrom. The fins, like the substrate, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin. The recesses may be etched using a dry etch (e.g., reactive ion etching), a wet etch, and/or other suitable processes. Numerous other embodiments of methods to form the fins on the substrate may also be used.

In an embodiment, a channel of a device will be formed in a first fin or first set of fins (e.g., a channel of an N-type field effect transistor (NFET)). Such a fin or set of fins may be referred to in the present disclosure as an N-fin(s). Further, N-type fins or N-fin(s) may include a P-type well, as described below. In an embodiment, a second fin or second set of fins is associated with a p-type device (e.g., including a channel of a P-type FET or PFET). Such a fin or set of fins may be referred to in the present disclosure as a P-fin(s). Further, P-type fins or P-fin(s) may include an N-type well, as described below.

Figure 2:
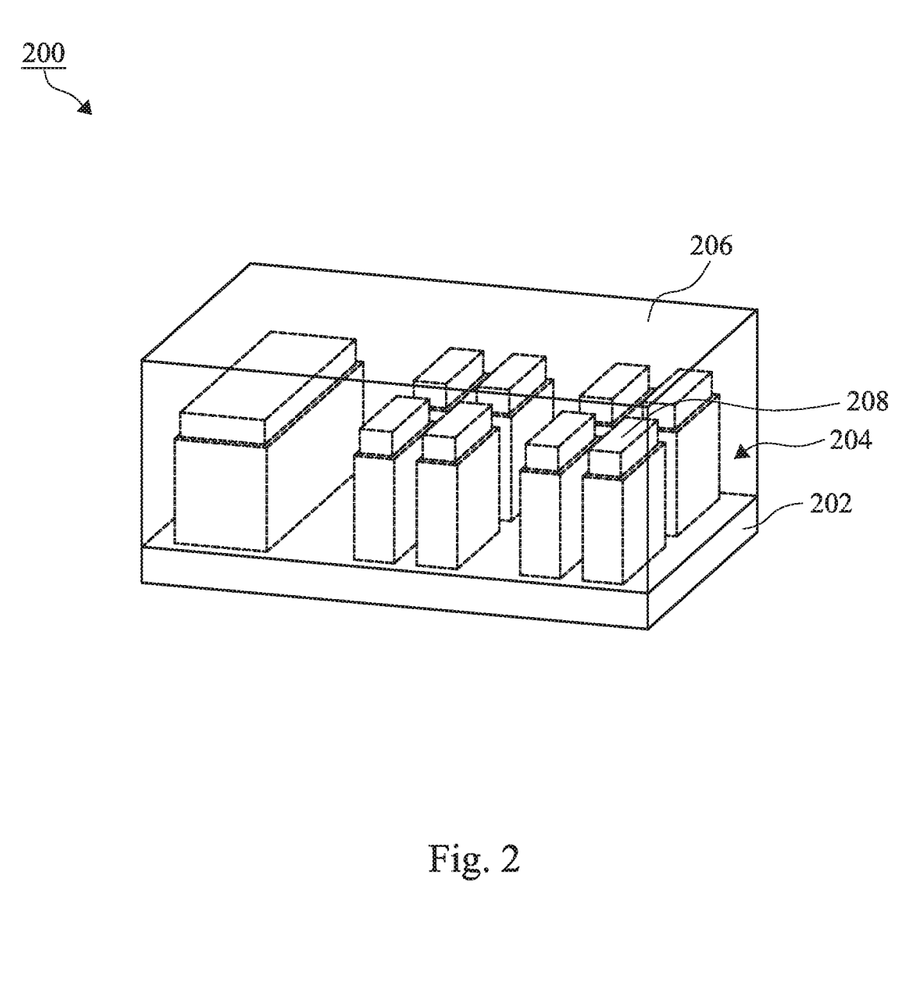
FIG. 2-7 illustrate isometric views of an embodiment of a device 200 having fins fabricated according to one or more aspects of the method of FIG. 1.

Referring to the example of FIG. 2, illustrated is a FinFET device 200. The FinFET device 200 includes one or more fin-based, multi-gate field-effect transistors (FETs). The FinFET device 200 includes a substrate 202, a plurality of fin elements 204 extending from the substrate 202, and an isolation region 206. In some embodiments, the isolation region 206 may include one or more shallow trench isolation (STI) features. As described above, the plurality of fin elements 204 may be patterned by photolithography or e-beam lithography, followed by etching using a dry etch (e.g., RIE), wet etch, or other suitable process. The etching process defines the plurality of fins 204 extending from the substrate 202 as well as trenches disposed between the plurality of fins 204. In some embodiments, a dielectric is deposited over the substrate 202, filling the trenches with the dielectric, and forming the isolation region 206. In some embodiments, the dielectric used to form the isolation region 206 includes $SiO_2$, silicon nitride, silicon oxynitride, fluorine-doped silicate glass (FSG), a low-k dielectric, other suitable materials, or combinations thereof, and/or other suitable material known in the art. The dielectric used in the formation of the isolation region 206 may be deposited by CVD, ALD, PVD, or other suitable process. In some embodiments, the dielectric used in the formation of the isolation region 206 is annealed to improve the quality of the dielectric. In some embodiments, a field oxide, a LOCOS feature, and/or other suitable isolation features may be implemented on and/or within the substrate. However, other embodiments are possible. For example, in some embodiments, the isolation region 206 may include a multi-layer structure, for example, having one or more liner layers.

As shown in the example of FIG. 2, each of the plurality of fin elements 204 may include a dielectric 208 formed over the fin elements 204. In some embodiments, the dielectric 208 includes a first dielectric layer formed over the fin element 204 and a second dielectric layer formed over the first dielectric layer. In some embodiments, the first dielectric layer includes a pad oxide layer (e.g., $SiO_2$) which may be used as a buffer layer between adjacent layers. In some embodiments, the first dielectric layer includes thermally grown oxide, CVD-deposited oxide, and/or ALD-deposited oxide. By way of example, the first dielectric layer may have a thickness of between approximately 5 nm and approximately 40 nm. In some embodiments, the second dielectric layer includes a pad nitride layer (e.g., $Si_3N_4$). The second dielectric layer may be deposited by CVD or other suitable technique, and in some examples the second dielectric layer may have a thickness of between approximately 20 nm and approximately 160 nm.

Figure 3:
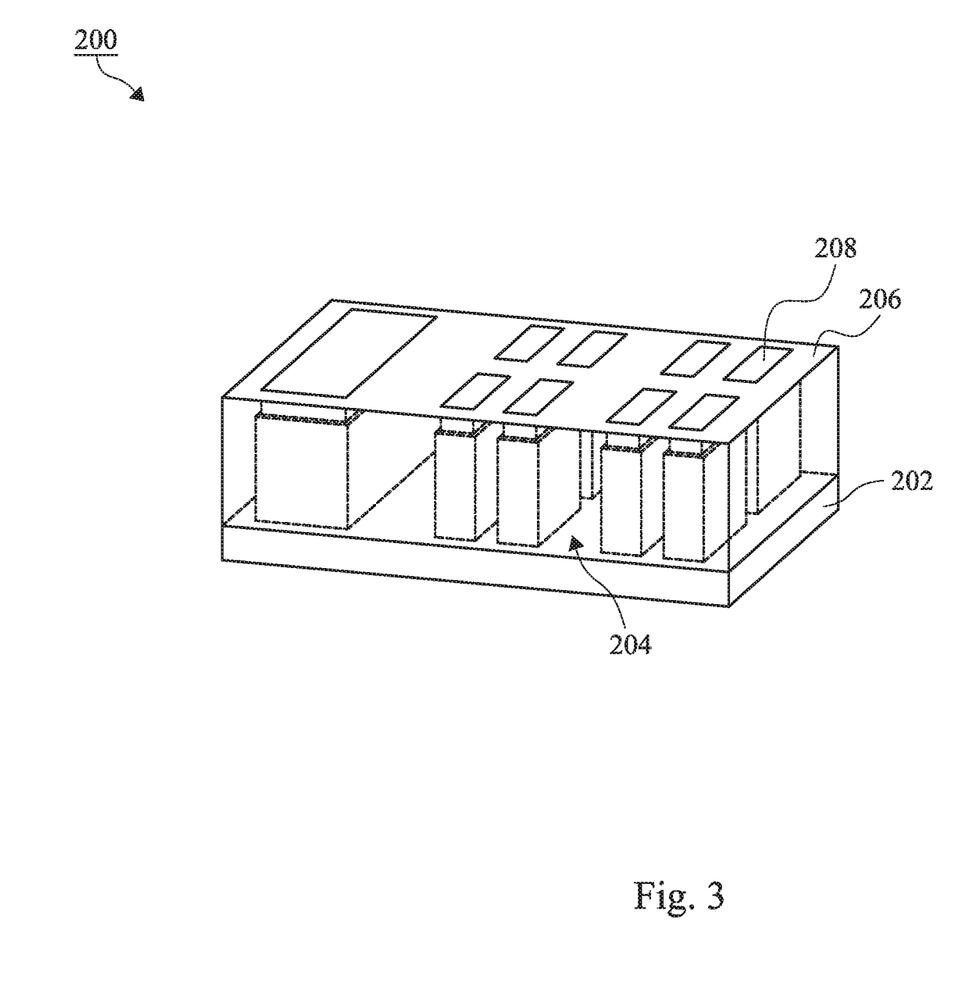
Figure 4:
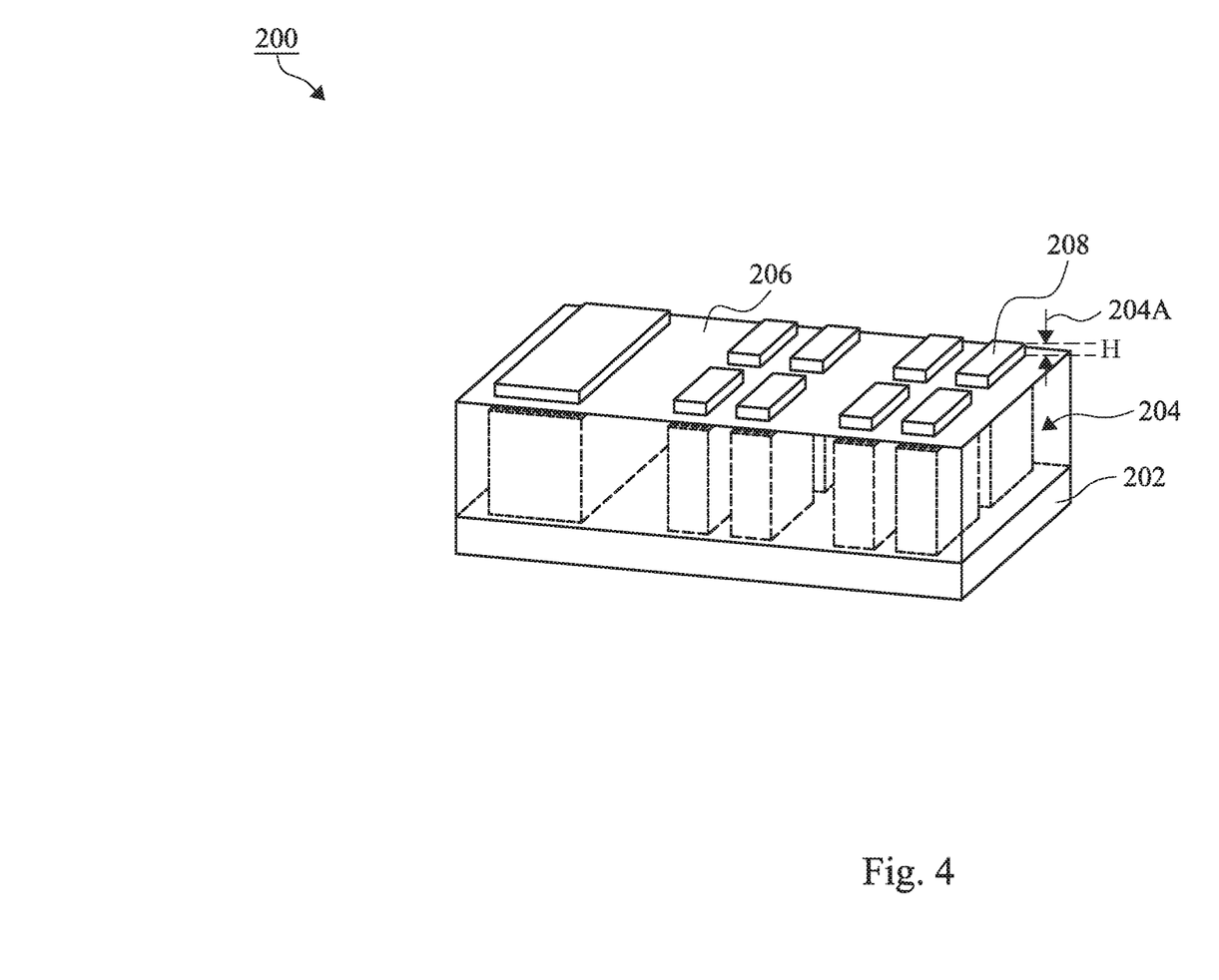

The method 100 then proceeds to block 104 where the isolation region 206 is thinned and planarized, for example by a CMP process. Referring to FIG. 3, an example of block 104 is shown. Specifically, the example of FIG. 3 illustrates the device 200 at an intermediate processing stage where a CMP process has been performed to remove excess dielectric material (used to form the isolation region 206) and planarize a top surface of the semiconductor device 200. In some embodiments, the isolation region 206 is configured to isolate fin active regions (e.g., fins 204). In some embodiments, the isolation region 206 interposing the fins 204 may include a multi-layer structure, for example, having one or more liner layers.

The method 100 then proceeds to block 106 where the isolation regions are recessed. In some embodiments, the recessing process may include a dry etching process, a wet etching process, and/or a combination thereof. For example, the recessing process may include a dry, plasma-free process using a reaction gas or reaction gas combination, such as $HF+NH_3$, $NF_3+NH_3$, and/or other suitable reaction gases. In some embodiments, the dry, plasma-free recessing process is performed using a CERTAS® Gas Chemical Etch System, available from Tokyo Electron Limited, Tokyo, Japan. In some embodiments, the dry, plasma-free recessing process is performed using a SICONI® System, available from Applied Materials, Inc., Santa Clara, Calif. In some examples, the recessing process may include a wet etch performed using a dilute mixture of HF (e.g., 49% HF in $H_2O$ by weight) and de-ionized (DI) $H_2O$, where the $HF:H_2O$ ratio is approximately 1:50 or approximately 1:100. Referring to the example of FIG. 4, the isolation region 206 around the fins 204 is recessed to laterally expose an upper portion 204A. In some embodiments, a recessing depth is controlled (e.g., by controlling an etching time) so as to result in a desired height 'H' of the exposed upper portion 204A. In embodiments, the exposed upper portion of the fins 204A may include at least a portion of the dielectric 208 formed over the fin elements 204.

Figure 5:
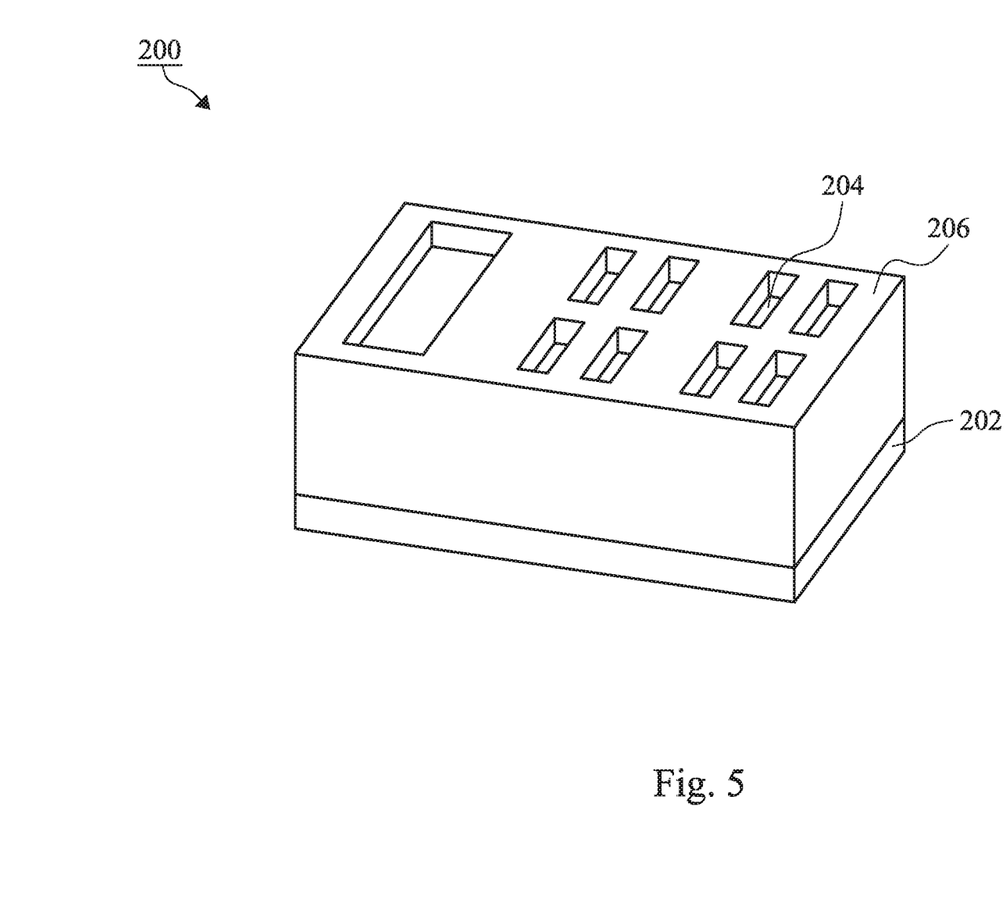

The method 100 then proceeds to block 108 where the dielectric 208 formed over the fin elements 204 is removed. In some embodiments, removal of the dielectric 208 includes removal of the pad nitride. In some embodiments, removal of the dielectric 208 includes removal of the pad nitride and the pad oxide. Removal of the dielectric 208, including one or both of the pad nitride and the pad oxide, may be performed by using a suitable etching process (e.g., dry or wet etching). In some embodiments, a CMP process may be performed to remove the dielectric 208, including one or both of the pad nitride and the pad oxide, and planarize the top surface of the semiconductor device 200. As an example of block 108, FIG. 5 illustrates the semiconductor device 200, where the dielectric 208 has been removed from the top portion of each of the fin elements 204, thereby exposing the underlying fin elements 204.

In existing semiconductor process flows, after removal of the pad nitride, and prior to removal of the pad oxide, a well implant is performed using an ion implantation process and employing a suitable N-type or P-type dopant. Alternatively, in existing process flows, after removal of the dielectric 208, an oxide layer may be regrown over the fin elements 204, followed by the well implant by way of an ion implantation process. In some embodiments, the fin elements 204 includes both N-type and P-type fins, where each of the N- and P-type fins are implanted using separate process steps. For example, in some embodiments, the regrown oxide may serve as a masking layer which can be patterned to expose one fin type (N- or P-type), while the other fin type is implanted. In some embodiments, other layers may be used as masking layers such as resist, nitride, etc. By way of example, an N-type dopant may include arsenic, phosphorous, antimony, or other N-type donor material. In other examples, a P-type dopant may include boron, aluminum, gallium, indium, or other P-type acceptor material. Conventionally, N-type or P-type dopants may be used to perform anti-punch through (APT) ion implantation through the fin elements 204. In some examples, other ion implantation processes may also be performed, including a threshold voltage ($V_t$) adjust implant, a halo implant, or other suitable implant.

While such ion implantation methods are commonly used in existing semiconductor process flows, there are several drawbacks. For example, the energetic ion beams employed in ion implantation processes are known to result in damage to the substrate material into which, or through which, such ion beam are injected. In the example above, an ion implantation process through the fin elements 204 can result in damage to the fin elements 204, including damage to a FinFET channel region, which can lead to carrier scattering and thus degrade device performance. Although a high temperature anneal may be used in an attempt to remove such defects (as well as for dopant activation), all defects introduced by ion implantation may not be removed and the substrate (or fin elements 204) may thus not be fully restored to its pre-ion implant condition. In addition, ion implantation processes may result in non-uniform doping profiles. In some examples, dopant implantation through fin elements 204 may result in a non-uniform doping profile that includes dopants distributed within the FinFET channel region. As known in the art, increased doping concentrations in a device channel can lead to decreased device mobility due to ionized impurity scattering. Thus, ion implantation processes can contribute to degraded device performance, for example, through ion implant damage and unwanted channel dopants due to non-uniform ion implant doping profiles.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for avoiding degradation to semiconductor devices that can occur due to ion implantation processes, including defect formation and the introduction of channel impurities. In some embodiments, an in-situ doped epitaxially grown layer is used to form a device well region (N-well or P-well), instead of using an ion implantation processes, and thus avoid such ion implant induced degradation. In some embodiments, an epitaxially grown undoped layer is formed over the in-situ doped epitaxially grown layer. The epitaxially grown undoped layer serves as an active device channel, and because the epitaxially grown undoped layer is substantially dopant free, carrier channel scattering is mitigated, and device mobility and drive current are improved. In various embodiments, the undoped layer (and thus the active device channel) has a dopant concentration of less than about $1 \times 10^{17}$ $cm^{-3}$. In some embodiments, each of the in-situ doped layer and the undoped layer each have a thickness of between about 10-40 nm. As described below, the methods and structures described herein may be applied to NFET or PFET devices. Further, while the discussion herein is directly primarily to FinFET devices, one of ordinary skill in the art in possession of this disclosure will appreciate that the methods and structures described herein may be equally applicable to other types of devices without departing from the scope of the present disclosure.

Returning to the method 100, the method 100 proceeds to block 110 where a doped layer is grown. In some embodiments, the doped layer includes a doped well grown by in-situ doping during an epitaxial growth process, as discussed below. By way of example, after removal of the dielectric 208 as illustrated in FIG. 5, an oxide layer may be regrown over the fin elements 204. In some embodiments, the oxide layer includes a silicon dioxide ($SiO_2$) layer deposited over the fin elements 204. Thereafter, a first photolithography (photo) step is performed to pattern the oxide layer (e.g., the SiO$_2$ layer) to expose a first group of fins of the fin elements 204 that are to form N- or P-type FinFETs, while a second group of fins of the fin elements 204 remains masked by the oxide layer. For example, the first photo step may include an N-well or P-well photo step. In some embodiments, the first photo step may include forming a photoresist layer (resist) over the substrate, exposing the resist to a pattern (e.g., defined by an N-well or P-well mask), performing post-exposure bake processes, and developing the resist to form a masking element including the resist. In some embodiments, oxide exposed after the resist development may be etched to expose the underlying first group of fins of the fin elements 204 that are to form N- or P-type FinFETs, corresponding to the mask (N-well or P-well mask) used for the first photo step.

As an example of the block 110, the doped well is formed by one or more epitaxial growth processes. In various embodiments, the epitaxial growth process may include a molecular beam epitaxy (MBE) process, a metalorganic chemical vapor deposition (MOCVD) process, and/or other suitable epitaxial growth process. In some embodiments, the doped well may be grown over the first group of fins of the fin elements 204 exposed by the first photo step and subsequent etch. Additionally, the doped well is in-situ doped during the epitaxial growth process. In some embodiments, the epitaxially grown doped well includes the same material as the substrate 202. In some embodiments, the epitaxially grown doped well includes a different material than the substrate 202. In various embodiments, the epitaxially grown doped well may include silicon, germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. Moreover, in various embodiments and depending on the well-type to be formed (N-well or P-well), the epitaxially grown doped well may be in-situ doped with an N-type dopant such as arsenic, phosphorous, antimony, or other N-type dopant, or with a P-type dopant such as boron, aluminum, gallium, indium, or other P-type dopant. As merely one example, epitaxially grown Si may be in-situ doped with boron for P-well growth, and subsequent NFET formation. In another example, epitaxially grown Si may be in-situ doped with phosphorous for N-well growth, and subsequent PFET formation. In some embodiments, the epitaxially grown doped well has a thickness range of about 10-40 nm. Further, because the N- or P-well are in-situ doped during an epitaxial growth process, the dopant distribution within the N- or P-well is substantially uniform across the well. In various embodiments, the epitaxially grown doped well is used instead of the ion implantation processes, discussed above, to form an in-situ doped APT layer, an in-situ doped threshold voltage (V$_t$) adjust layer, an in-situ doped halo layer, or other suitable in-situ doped layer. In some embodiments, the doped N- or P-well includes an in-situ dopant concentration in the range of about $1\times10^{17}$-$5\times10^{18}$/cm$^3$ for either N-type or P-type dopant.

Figure 6:
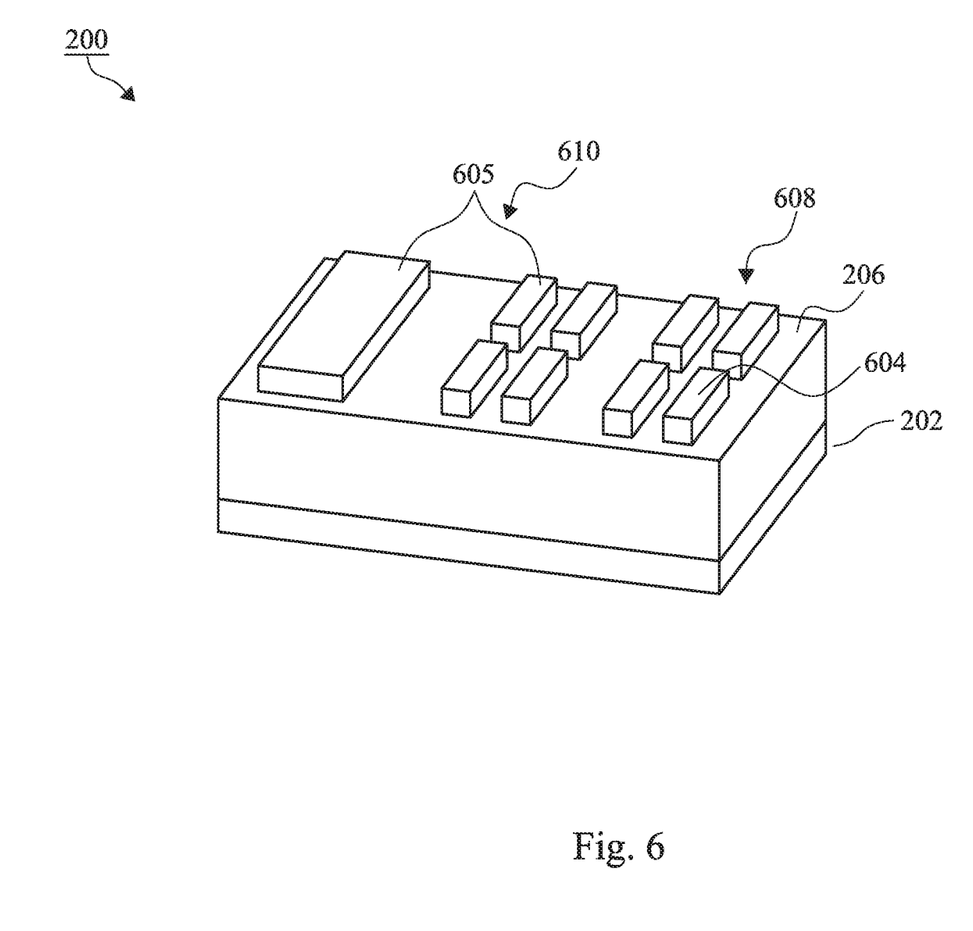

After formation of the epitaxially grown doped well, the method 100 proceeds to block 112 where an undoped layer is grown. In some embodiments, the undoped layer includes an undoped channel region formed by an epitaxial growth process directly on top of the epitaxially grown doped well. In some embodiments, the epitaxially grown undoped channel region is substantially dopant free (i.e., having a dopant concentration equal to about 0 cm$^{-3}$). In some embodiments, the epitaxially grown undoped channel region has a dopant concentration less than about $1\times10^{17}$ cm$^{-3}$. In some embodiments, the epitaxially grown undoped channel region has a thickness range of about 10-40 nm. In various embodiments, as described in more detail below, the epitaxially grown undoped channel region serves as the active FinFET channel. Thus, carrier scattering through the active FinFET channel will be substantially reduced for FinFET devices including the substantially dopant-free epitaxially grown undoped channel region described herein. In some embodiments, formation of a substantially dopant-free channel region, using one or more of the methods described herein, may result in an increase of about 7% in device ON-current (I$_{ON}$). As an example of blocks 110 and 112, and with reference to FIG. 6, illustrated therein is a doped layer/undoped layer stack 604, for example including a doped well/undoped channel stack. In some embodiments, the doped layer/undoped layer stack 604 corresponds to the fin-type (N- or P-type) for a first group of fins 608 of the fin elements 204. For example, the doped layer/undoped layer stack 604 may be formed over the first group of fins of the fin elements 204 exposed by the first photo step and subsequent etch (FIG. 5), as described above with reference to blocks 110 and 112 of the method 100.

Following formation of the doped well/undoped channel stack 604 that corresponds to the fin-type (N- or P-type) for the first group of fins, the method 100 may substantially repeat blocks 110 and 112 for the formation of a second doped layer/undoped layer stack 605, which corresponds to the fin-type (N- or P-type) for a second group of fins 610. For example, a second photo step can be performed to pattern and etch the oxide layer (e.g., the SiO$_2$ layer) to expose a second group of fins of the fin elements 204, while the first group of fins remains masked by the resist layer. In some embodiments, the second photo step may include an N-well or P-well photo step. In some embodiments, the second photo step may include forming a photoresist layer (resist) over the substrate, exposing the resist to a pattern (e.g., defined by an N-well or P-well mask), performing post-exposure bake processes, and developing the resist to form a masking element including the resist. By way of example, oxide exposed after the resist development may be etched to expose the underlying second group of fins of the fin elements 204 that are to form N- or P-type FinFETs, corresponding to the mask (N-well or P-well mask) used for the second photo step.

Thus, similar to the doped layer/undoped layer stack 604, the doped layer/undoped layer stack 605 may be formed over the second group of fins of the fin elements 204 exposed by the second photo step and subsequent etch. The doped layer of the doped layer/undoped layer stack 605 may be formed by one or more in-situ doped epitaxial growth processes over the exposed second group of fins. In various embodiments and depending on the well-type to be formed (N-well or P-well), the epitaxially grown doped layer may be in-situ doped with an N-type dopant or a P-type dopant, as described above. In some embodiments, the epitaxially grown doped layer grown over the exposed second group of fins has a thickness range of about 10-40 nm. Thereafter, the undoped layer (i.e., undoped channel region) of the doped layer/undoped layer stack 605 is formed by an epitaxial growth process directly on top of the epitaxially grown doped layer of the doped layer/undoped layer stack 605. As described above, the epitaxially grown undoped channel region serves as the active FinFET channel and is substantially dopant free (i.e., having a dopant concentration equal to about 0 cm$^{-3}$). In some embodiments, the epitaxially grown undoped channel region has a dopant concentration less than about 1×10$^{17}$ cm$^{-3}$. In some embodiments, the epitaxially grown undoped channel region has a thickness range of about 10-40 nm.

The method 100 then proceeds to block 114 where a gate stack and sidewall spacers disposed on sidewalls of the gate stack are formed. In an embodiment, the gate stack is a dummy gate stack. In other embodiments of the method 100, the gate stack may be a high-k/metal gate stack. While the method 100 is described below with reference to a replacement gate process, those skilled in the art will readily appreciate that the methods and structures disclosed herein may equally apply to a gate-first process.

Figure 7:
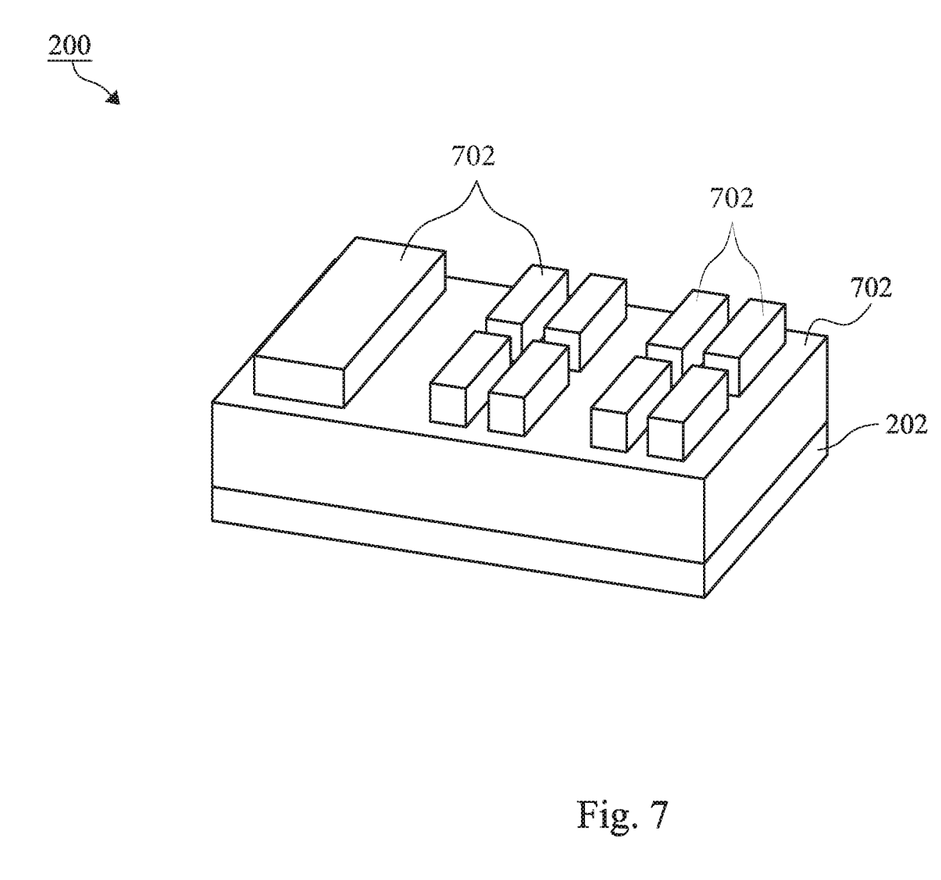

In one embodiment using a gate-last process, the gate stack is a dummy gate stack and will be replaced by the final gate stack at a subsequent processing stage of the semiconductor device 200. In particular, the gate stack may be replaced at a later processing stage by a high-K dielectric layer (HK) and metal gate electrode (MG). In some embodiments, the gate stack is formed over the substrate 202 and is at least partially disposed over the fin elements 204. In one embodiment, the gate stack includes a dielectric layer, an electrode layer, and a hard mask. Merely for illustrative purposes, FIG. 7 shows the semiconductor device 200, after formation of the doped layer/undoped layer stacks 604, 605, further including a blanket dielectric layer 702 formed over the semiconductor device 200. In some embodiments, the dielectric layer 702 includes a gate stack dielectric layer. In some embodiments, the dielectric layer 702 includes an input/output (I/O) oxide layer. In some examples, the I/O oxide layer includes an oxide layer configured to provide protection from electrostatic discharge (ESD) events. In some embodiments, the gate stack is formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer of the gate stack includes silicon oxide. Alternatively or additionally, the dielectric layer of the gate stack may include silicon nitride, a high-K dielectric material or other suitable material. In some embodiments, the electrode layer of the gate stack may include polycrystalline silicon (polysilicon). In some embodiments, the hard mask of the gate stack includes a suitable dielectric material, such as silicon nitride, silicon oxynitride or silicon carbide.

In various embodiments, sidewall spacers are disposed on the sidewalls of the gate stack. The sidewall spacers may include a dielectric material such as silicon oxide, silicon nitride, silicon carbide, silicon oxynitride, or combinations thereof. In some embodiments, the sidewall spacers include multiple layers, such as main spacer walls, liner layers, and the like. By way of example, the sidewall spacers may be formed by depositing a dielectric material over the gate stack and anisotropically etching back the dielectric material. In some embodiments, the etch-back process (e.g., for spacer formation) may include a multiple-step etching process to improve etch selectivity and provide over-etch control. In some embodiments, prior to forming the sidewall spacers, an ion implantation process may be performed to form lightly-doped drain (LDD) features within the semiconductor device 200. In other embodiments, such LDD features may be formed by epitaxial growth of an in-situ doped layer prior to forming the sidewall spacers. In some embodiments, a plasma doping (PLAD) process may be used to form the LDD features. In yet other embodiments, an ion implantation process may be performed after forming the sidewall spacers 1202 to form the LDD features. Similar to the separate processing of the doped layer/undoped layer stacks 604, 605 corresponding to each of the first and second group of fins described above, formation of the LDD features may be performed in separate processing sequences for each of N-type and P-type LDD regions. In some embodiments, after formation of the LDD features, the semiconductor device 200 may be subject to a high thermal budget process (anneal) to remove defects and activate dopants (i.e., to place dopants into substitutional sites).

Referring again to the method 100, the method 100 proceeds to block 116 where source/drain features are formed in source/drain regions. In some embodiments, the source/drain features are formed by epitaxially growing a semiconductor material layer in the source/drain regions. In some examples, dummy sidewall spacers may be formed prior to epitaxial source/drain growth and removed after epitaxial source/drain growth. Additionally, the main sidewall spacers may be formed, as described above, after epitaxial source/drain growth. In various embodiments, the semiconductor material layer grown in the source/drain regions includes Ge, Si, GaAs, AlGaAs, SiGe, GaAsP, SiP, or other suitable material. The source/drain features may be formed by one or more epitaxial (epi) processes. In some embodiments, the source/drain features may be in-situ doped during the epi process. For example, in some embodiments, epitaxially grown SiGe source/drain features may be doped with boron. In other examples, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features are not in-situ doped, and instead an implantation process is performed to dope the source/drain features. In various embodiments, a doping dose used to dope the source/drain features is greater than a doping dose used to dope the LDD features. Similar to the separate processing of the doped layer/undoped layer stacks 604, 605 corresponding to each of the first and second group of fins described above, formation of the source/drain features may be performed in separate processing sequences for each of N-type and P-type source/drain features. In some embodiments, after formation of the source/drain features, a dual epi anneal process may be performed, where the semiconductor device 200 is subjected to a high thermal budget process.

In some embodiments, after forming the source/drain features (block 116), etch stop and dielectric layers may be formed on the substrate 202. For example, a contact etch stop layer (CESL) and an inter-layer dielectric (ILD) layer may be formed over the substrate 202. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique. In some embodiments, after formation of the ILD layer, the semiconductor device 200 may be subject to a high thermal budget process to anneal the ILD layer. In some examples, a planarization process may be performed to expose a top surface of the dummy gate stack. For example, a planarization process includes a chemical mechanical planarization (CMP) process which removes portions of the CESL and ILD layer overlying the dummy gate stack and planarizes a top surface of the semiconductor device 200. In addition, the CMP process removes the hard mask overlying the dummy gate stack to expose the electrode layer, such as a polysilicon electrode layer.

In an embodiment, the method 100 then proceeds to block 118 where the replacement gate stack is formed. In some embodiments, the previously formed gate stack features (e.g., dummy gate stack) are removed from the substrate. The removal of the gate stack features (e.g., the dielectric layer and/or the electrode layer) from the gate stack may result in a trench, and a final gate structure (e.g., including a high-K dielectric layer and metal gate electrode) may be subsequently formed in the trench. The removal of the dummy gate stack features may include a selective etch process including a selective wet etch or a selective dry etch.

Thereafter, a high-K/metal gate stack is formed on the device 200. The high-K/metal gate stack includes an interfacial layer formed over the substantially dopant-free channel material of the fin, a high-K gate dielectric layer formed over the interfacial layer, and a metal layer formed over the high-K gate dielectric layer. High-K gate dielectrics, as used and described herein, include dielectric material having a high dielectric constant, for example, greater than that of thermal silicon oxide (~3.9). The metal layer used within high-K/metal gate stack may include a metal, metal alloy, or metal silicide. Additionally, the formation of the high-K/metal gate stack includes depositions to form various gate materials and one or more CMP processes to remove excessive gate materials and thereby planarize a top surface of the semiconductor device 200.

The interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer of the high-K/metal gate stack may include a high-K dielectric layer such as hafnium oxide ($HfO_2$). Alternatively, the gate dielectric layer of the high-K/metal gate stack may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods. The metal layer of the high-K/metal gate stack may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the high-K/metal gate stack may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer may provide an N-type or P-type work function, may serve as a transistor (e.g., FinFET) gate electrode, and in at least some embodiments, the metal layer 114 may include a polysilicon layer. In various embodiments, the metal layer of the high-K/metal gate stack may be formed by ALD, PVD, CVD, e-beam evaporation, or other suitable process. Further, the metal layer of the high-K/metal gate stack may be formed separately for N-FET and P-FET transistors which may use different metal layers. In various embodiments, a CMP process may be performed to remove excessive metal from the metal layer of the high-K/metal gate stack, and thereby provide a substantially planar top surface of the metal layer of the high-K/metal gate stack.

The semiconductor device 200 may undergo further processing to form various features and regions known in the art. For example, subsequent processing may form interlayer dielectric (ILD) layer(s), contact openings, contact metal, as well as various contacts/vias/lines and multilayers interconnect features (e.g., metal layers and interlayer dielectrics) on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. The various interconnection layers, materials, and/or other features described above may, in various embodiments, be used to form contact features 820a and 820b, described below with reference to FIG. 8. Moreover, additional process steps may be implemented before, during, and after the method 100, and some process steps described above may be replaced or eliminated in accordance with various embodiments of the method 100.

Figure 8:
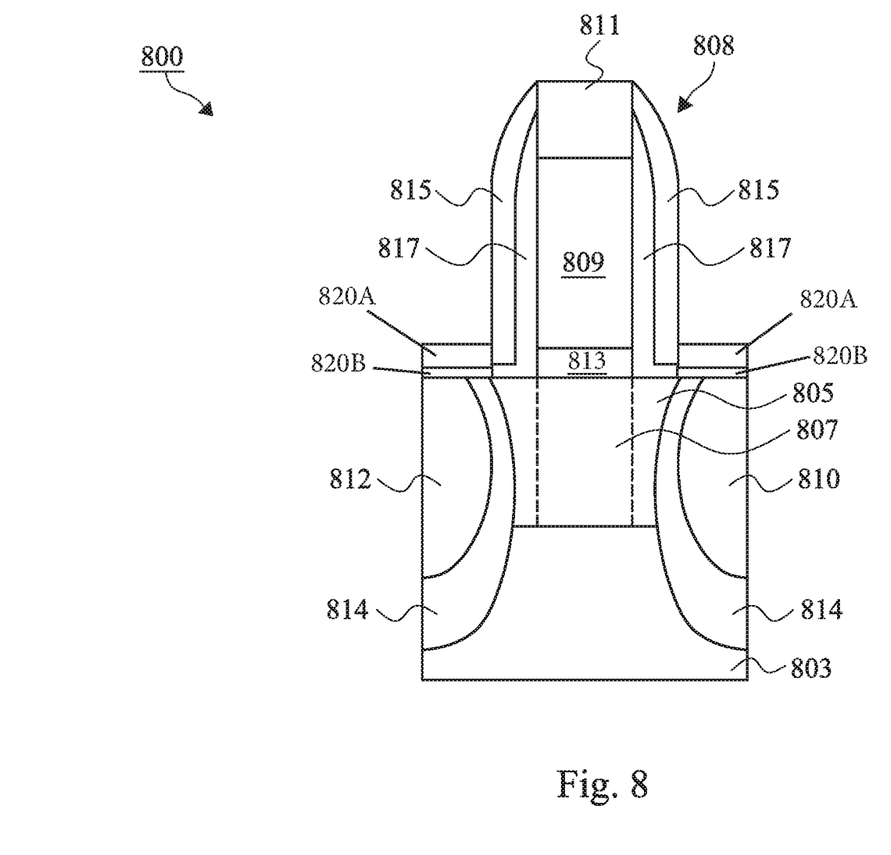
FIG. 8 illustrates a perspective view of an embodiment of the device 200.

Referring now to FIG. 8, therein is illustrated a FinFET device 800 fabricated in accordance with one or more of the steps of the method 100. The FinFET device 800 is formed on a substrate (e.g., the substrate 202) having one or more fin elements (e.g., the fin elements 204). In particular, the device 800 includes an in-situ doped epitaxially grown layer 803 formed over a fin element (e.g., the fin elements 204), and an epitaxially grown undoped layer 805 formed over the in-situ doped epitaxially grown layer 803. In various embodiments, the in-situ doped epitaxially grown layer 803 includes an N- or P-type well, which for example may be used to form an in-situ doped APT layer, an in-situ doped threshold voltage ($V_t$) adjust layer, an in-situ doped halo layer, or other suitable in-situ doped layer. In various embodiments, the epitaxially grown undoped layer 805 includes an undoped device channel 807 which effectively mitigates carrier channel scattering, resulting in improved device mobility and drive current. In various embodiments, the undoped layer 805, and thus the active device channel 807, has a dopant concentration of less than about $1\times10^{17}$ $cm^{-3}$. In some embodiments, each of the in-situ doped layer and the undoped layer each have a thickness of between about 10-40 nm. In some embodiments, the device 800 includes an N-type FinFET. In some embodiments, the device 800 includes a P-type FinFET.

The device 800 further includes a source region 810 and a drain region 812, as well as LDD regions 814. In some embodiments, the source and drain regions 810, 812 are formed adjacent to and on either side of the undoped device channel 807. In some embodiments, the source and drain regions 810, 812 may be epitaxially grown. In various examples, contact features 820a and 820b may be formed over the source and drain regions 810, 812. The contact features 820a and 820b may include one or more of the interconnection layers, materials, and/or other features as described above. In addition, the device 800 includes a gate structure 808 formed over the undoped device channel 807. In some examples, the undoped layer 805, and thus the active device channel 807, includes silicon. In other examples, the undoped layer 805, and thus the active device channel 807, includes a high-mobility material such as germanium, as well as any of the compound semiconductors or alloy semiconductors discussed above and/or combinations thereof.

The gate structure 808 includes a gate stack having an interfacial layer 813 formed over the undoped device channel 807, a gate dielectric layer 809 formed over the interfacial layer 813, and a metal layer 811 formed over the gate dielectric layer 809. The interfacial layer 813 may include a dielectric material such as silicon oxide layer (SiO$_2$) or silicon oxynitride (SiON). The gate dielectric layer 809 may include a high-k dielectric layer, silicon dioxide or other suitable dielectric. The metal layer 811 may include one or more of a plurality of conductive layers, described above, or combinations thereof. Each of the interfacial layer, the gate dielectric layer 809, and the metal layer 811 may be formed by one or more of the methods described above. In some embodiments, sidewall spacers 815, 817 formed on sidewalls of the gate structure 808. The sidewall spacers 815, 817 may include a dielectric material such as silicon oxide, silicon nitride, silicon carbide, silicon oxynitride, or combinations thereof, and may be formed as previously described.

With respect to the description provided herein, the present disclosure offers methods and structures for avoiding degradation to semiconductor devices that can occur due to ion implantation processes, including defect formation and the introduction of channel impurities (i.e., unwanted channel dopants). In some examples, an in-situ doped epitaxially grown layer is used to form a device well region (N-well or P-well), instead of using an ion implantation processes, and thus avoid ion implant induced degradation. An epitaxially grown undoped layer is formed over the in-situ doped epitaxially grown layer, where the epitaxially grown undoped layer functions as the active device channel. Thus, embodiments of the present disclosure provide a substantially dopant free FinFET device channel, which directly improves device mobility and drive current. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a semiconductor device (e.g., a FinFET device) having a substantially undoped channel region. In some embodiments, the method includes providing a substrate having a fin extending from the substrate. In various embodiments, an in-situ doped layer is formed on the fin. By way of example, the in-situ doped layer may include an in-situ doped well region formed by an epitaxial growth process. After formation of the in-situ doped layer on the fin, an undoped layer is formed on the in-situ doped layer. By way of example, the undoped layer may include an undoped channel region formed by an epitaxial growth process.

In another of the embodiments, discussed is a method where a substrate including a plurality of fins extending therefrom is provided. In various embodiments, an isolation region that isolates each of the plurality of fins from each another is formed. In some examples, an in-situ doped N-well region is formed on a first group of fins of the plurality of fins, after which an undoped channel region is formed on the in-situ doped N-well region. Additionally, in some embodiments, an in-situ doped P-well region is formed on a second group of fins of the plurality of fins, after which an undoped channel region is formed on the in-situ doped P-well region In yet another of the embodiments, discussed is a semiconductor device including a substrate having a fin, an in-situ doped layer formed over the fin, an undoped layer formed over the in-situ layer, and a gate stack formed over undoped layer. In some embodiments, the in-situ doped layer includes a well region and the undoped layer includes a channel region. In some examples, the in-situ doped layer and the undoped layer each have a thickness of between about 10-40 nm. In addition, various embodiments include a source region and a drain region adjacent to and on either side of the undoped channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a doped semiconductor material layer disposed on a substrate;
   an undoped semiconductor material layer disposed on the doped semiconductor material layer, the undoped semiconductor material layer including a top surface facing away from the substrate;
   a gate structure disposed over the undoped semiconductor material layer, the gate structure including a gate electrode and a gate dielectric layer;
   a lightly doped drain (LDD) region disposed in the substrate and directly interfacing with the undoped semiconductor material layer; and
   a sidewall spacer disposed along a sidewall of the gate structure and extending to the top surface of the undoped semiconductor material layer such that the sidewall spacer physically contacts the top surface of the undoped semiconductor material layer, the sidewall spacer disposed over at least a portion of the LDD region.

2. The device of claim 1, further comprising a fin structure disposed over the substrate, and wherein the doped semiconductor material layer is disposed over the fin structure.

3. The device of claim 2, wherein the fin structure is formed of a first semiconductor material and the doped semiconductor material layer is formed of the first semiconductor material.

4. The device of claim 2, wherein the fin structure is formed of a first semiconductor material and the doped semiconductor material layer is formed of a second semiconductor material that is different from the first semiconductor material.

5. The device of claim 1, wherein the LDD region further directly interfaces with the doped semiconductor material layer.

6. The device of claim 1, wherein the gate dielectric layer physically contacts the top surface of the undoped semiconductor material layer.

7. The device of claim 1, wherein the undoped semiconductor material layer has a dopant concentration of less than about $1 \times 10^{17}$ cm$^{-3}$.

8. The device of claim 1, wherein the undoped semiconductor material layer includes a material selected from the group consisting of silicon and germanium.

9. A device comprising:
a doped semiconductor material layer disposed on a substrate;
an undoped semiconductor material layer disposed directly on the doped semiconductor material layer such that the undoped semiconductor material layer physically contacts the doped semiconductor material layer, the undoped semiconductor material layer includes a first sidewall surface and an opposing second sidewall surface and a top surface extending from the first sidewall surface to the second sidewall surface, wherein the undoped semiconductor material layer includes an upper portion having a first width and a lower portion having a second width that is different than the first width;
a gate structure disposed over the undoped semiconductor material layer, the gate structure including a gate electrode and a gate dielectric layer;
a first lightly doped drain (LDD) region disposed in the substrate and physically contacting the first sidewall surface of the undoped semiconductor material layer; and
a sidewall spacer disposed along a sidewall of the gate structure and extending to the top surface of the undoped semiconductor material layer such that the sidewall spacer physically contacts the top surface of the undoped semiconductor material layer, the sidewall spacer disposed over at least a portion of the LDD region.

10. The device of claim 9, wherein the first and second sidewall surfaces of the undoped semiconductor material layer are curved.

11. The device of claim 9, wherein the first width is greater than the second width.

12. The device of claim 9, wherein the first LDD region physically contacting the entire first sidewall surface of the undoped semiconductor material layer.

13. The device of claim 9, wherein the first LDD region physically contacts the doped semiconductor material layer.

14. The device of claim 9, further comprising a contact feature disposed over the substrate and interfacing with the top surface of the undoped semiconductor material layer.

15. The device of claim 9, further comprising a second LDD region disposed in the substrate and physically contacting the second sidewall surface of the undoped semiconductor material layer.

16. A device comprising:
a first doped material layer disposed over a substrate, the first doped material layer including a first dopant of a first type of conductivity;
a first undoped material layer disposed on the first doped material layer;
a second doped layer disposed over the substrate, the second doped layer including a second dopant of a second type of conductivity that is opposite the first type of conductivity;
a second undoped material layer disposed on the second doped layer;
a first gate structure disposed over the first undoped material layer;
a second gate structure disposed over the second undoped material layer;
a first lightly doped drain (LDD) region disposed along an edge of the first undoped material layer such that the first LDD region directly interfaces with the first undoped material layer; and
a first sidewall spacer disposed along a sidewall of the first gate structure and physically contacting the first undoped material layer, the first sidewall spacer disposed over at least a portion of the first LDD region.

17. The device of claim 16, further comprising:
a second LDD region disposed along an edge of the second undoped material layer such that the second LDD region directly interfaces with the second undoped material layer; and
a second sidewall spacer disposed along a sidewall of the second gate structure and physically contacting the second undoped material layer, the second sidewall spacer disposed over at least a portion of the second LDD region.

18. The device of claim 16, wherein the LDD region covers the entire edge of the first undoped material layer.

19. The device of claim 16, wherein at least one of the first doped material layer and the first undoped material layer includes a semiconductor material.

20. The device of claim 16, wherein the first doped material layer includes silicon and the second doped material layer includes germanium.

* * * * *